(12) United States Patent
Behera et al.

(10) Patent No.: US 7,904,766 B1
(45) Date of Patent: Mar. 8, 2011

(54) STATISTICAL YIELD OF A SYSTEM-ON-A-CHIP

(75) Inventors: Niranjan Behera, Newark, CA (US); Alexander Shubat, Los Altos Hills, CA (US)

(73) Assignee: Synopsys, Inc., Mountain View, CA (US)

( * ) Notice: Subject to any disclaimer, the term of this patent is extended or adjusted under 35 U.S.C. 154(b) by 470 days.

(21) Appl. No.: 11/951,338

(22) Filed: Dec. 6, 2007

(51) Int. Cl.
*G11C 29/00* (2006.01)
*G01R 31/30* (2006.01)
*G06F 11/00* (2006.01)

(52) U.S. Cl. .......... 714/718; 714/745; 365/200; 365/201

(58) Field of Classification Search .................. 714/718, 714/723, 735, 710, 711, 745, 819, 824, 8, 714/42; 365/200, 201
See application file for complete search history.

(56) References Cited

U.S. PATENT DOCUMENTS

| 5,034,923 | A | * | 7/1991 | Kuo et al. | 365/189.16 |
| 5,337,318 | A | * | 8/1994 | Tsukakoshi et al. | 714/708 |
| 5,488,578 | A | * | 1/1996 | Yamada | 365/49.17 |
| 6,453,433 | B1 | * | 9/2002 | Vollrath | 714/718 |

* cited by examiner

*Primary Examiner* — Christine T Tu
(74) *Attorney, Agent, or Firm* — Kanika Radhakrishnan; Evergreen Valley Law Group, P.C.

(57) ABSTRACT

Improving statistical yield of a system-on-a-chip. The system-on-a-chip includes several memory systems. Each memory system includes a large number of memories. The memories are tested to identify any faulty memories. One or more margins of the faulty memories are then varied and the memories are then tested again.

20 Claims, 5 Drawing Sheets

STATISTICAL YIELD OF A SYSTEM-ON-A-CHIP

BACKGROUND

A system-on-a-chip (SOC) typically includes, among other components, several memory systems. Each memory system includes a large number of memories. As new SOC designs call for more and more memory systems and other components, statistical yield becomes a more and more significant factor in the cost of producing an SOC. Since the memory systems including several memories constitute a significant portion of the SOC, improving the statistical yield of the memories should correspondingly improve the statistical yield of the SOC as a whole.

In a conventional method for improving the statistical yield of a SOC, a repairing scheme is used. FIG. 1 is a block diagram of a system 100 in accordance with the prior art. System 100 includes a memory 102 having a redundant column, a test wrapper 104 and a processor 106. Processor 106 such as a built-in self-test and repair (BISTR) processor sends a command to test wrapper 104 to perform a test on memory 102. Test wrapper 104 stores fault information obtained from this testing. Thereafter, processor 106 analyzes the fault information. Based on the analysis a fault is determined as a repairable fault or a fatal fault. If the failures in memory 102 are on more than one column then the fault is determined as fatal. If the failures in memory 102 are on on one column then the fault is repaired by substituting the redundant column for the faulty column. The substitution may be performed by substituting the address of the redundant column for the address of the faulty column in a rewritable address table.

However, the number of redundant column available is one per memory and hence, a memory with failures on more than one column is not repairable. This reduces the statistical yield of the memories and in turn reduces the statistical yield of the memory systems and the SOC including the memory systems. Process-related parameter variations such as implant gradient and device threshold variation cause margin failures which tend to be on multiple bits. These margin failures in the memories reduce the statistical yield. Therefore, there is a need for a scheme to improve statistical yield of the SOC.

SUMMARY

Embodiments of the invention described herein provide a method, system and computer program product for improving statistical yield of a system-on-a-chip.

An example method for improving statistical yield of a system-on-a-chip including at least one memory is provided. The method includes determining at least one faulty memory. One or more margins of the at least one faulty memory are then varied. Thereafter, at least one faulty memory with varied one or more margins is tested.

Another example method includes identifying a plurality of faulty columns in a memory. One or more margins of the memory are then varied based on types of failures of the plurality of faulty columns. Thereafter, memory with varied one or more margins is tested.

An example system includes at least one memory. The system includes one or more enhance registers corresponding to the at least one memory for indicating one or more margins that must be varied. The system also includes a processor for varying one or more margins of at least one faulty memory. Further, the system includes at least one test wrapper for testing at least one faulty memory with varied one or more margins.

An example computer program product for improving statistical yield of a system-on-a-chip including at least one memory is provided. The computer program product includes a computer readable program code. The computer readable program code determines at least one faulty memory. One or more margins of the at least one faulty memory are then varied. Thereafter, a command is sent to test at least one faulty memory with varied one or more margins.

DETAILED DESCRIPTION OF THE EMBODIMENTS

Embodiments of the invention provide a method, system and computer program product for improving statistical yield of system-on-chips (SOCs). A system-on-a-chip (SOC) includes several memory systems. Each memory system includes several memories. The memories are tested to determine at least one faulty memory. One or more margins of the at least one faulty memory are then varied. Thereafter, at least one faulty memory with varied one or more margins is tested.

Figure 1:
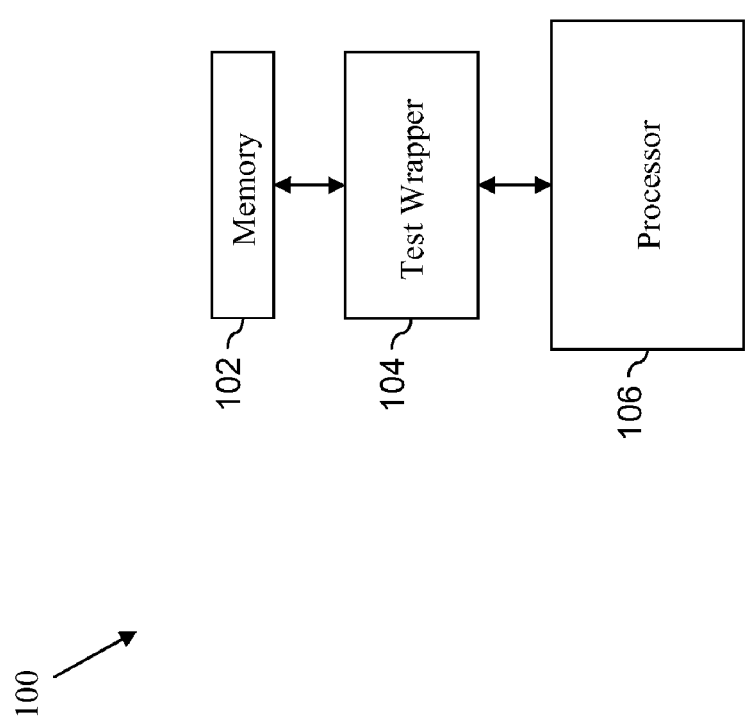
FIG. 1 is a block diagram of a system in accordance with the prior art.
Figure 2:
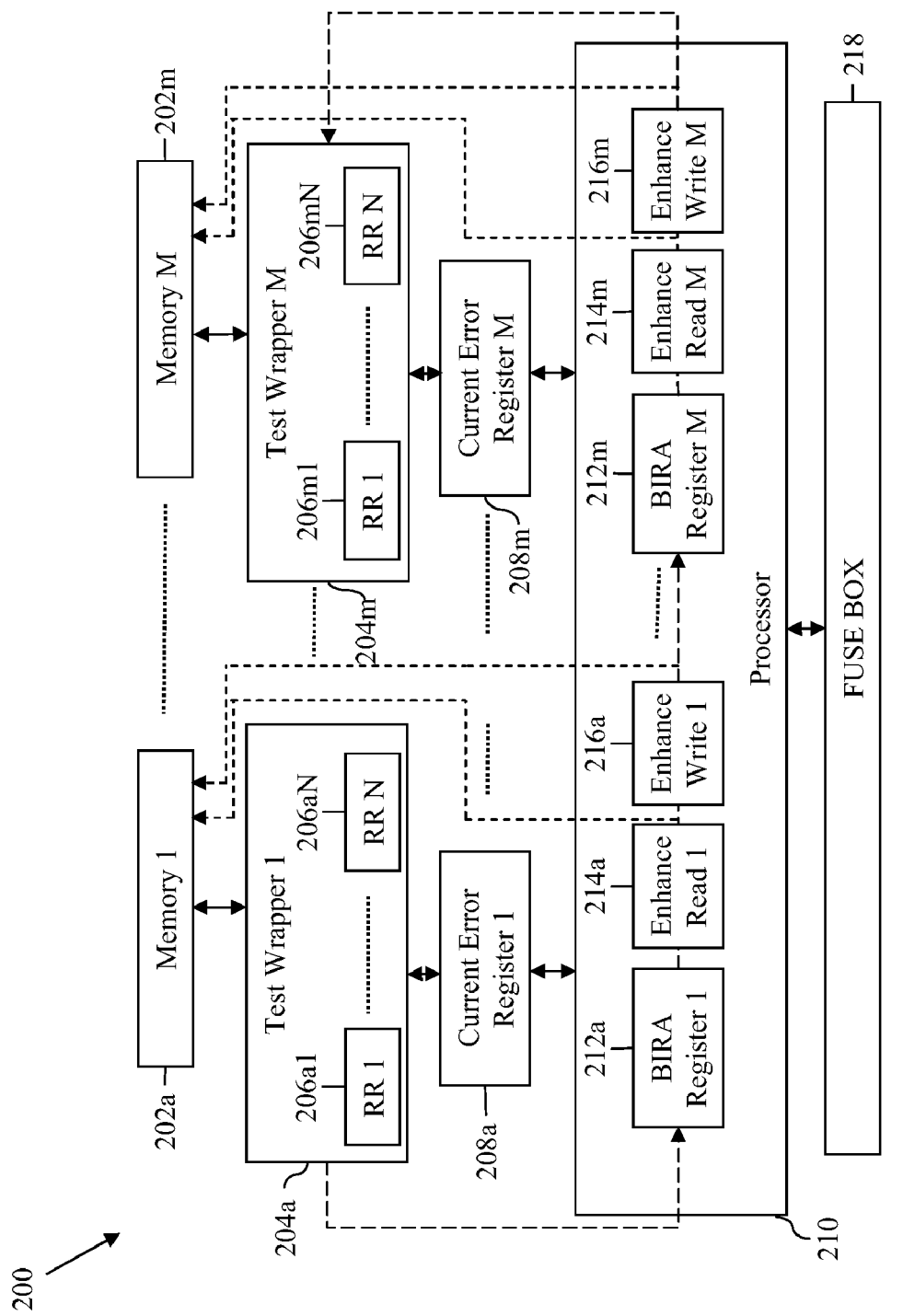
FIG. 2 is a schematic representation of a system in accordance with an embodiment of the invention.

FIG. 2 is a schematic representation of a system 200 in accordance with an embodiment of the invention. System 200 includes at least one memory including a memory 202a and a memory 202m, at least one test wrapper including a test wrapper 204a and a test wrapper 204m, one or more repair registers including a repair register 206a1, a repair register 206aN, a repair register 206m1, and a repair register 206mN, one or more current error registers including a current error register 208a and a current error register 208m, a processor 210, one or more built-in repair analysis (BIRA) registers including a BIRA register 212a and a BIRA register 212m, one or more enhance read registers including an enhance read register 214a and an enhance read register 214m, one or more enhance write registers including an enhance write register 216a and an enhance write register 216m, and a fuse box 218.

Examples of system 200 include but are not limited to electronic devices, SOCs and memory systems. In an embodiment of the invention, system 200 may be a self-test and repair (STAR) memory system.

Examples of the at least one memory include but are not limited to single port static random access memories (SRAMs), dual port SRAMs and synchronous SRAMs. Memory 202a and memory 202m may be SRAMs with self-timed clocking schemes. Each of memory 202a and memory 202m may include a memory array including one or more bit cell structures and at least one bit cell mimicking structure, a decoder and a repair element such as a redundant column. The at least one bit cell mimicking structure may be a programmable self-timed circuit that controls one or more margins of the memories.

Examples of the at least one test wrapper include but are not limited to intelligent wrappers, soft wrappers, and test and repair logic (TRL) wrappers. The at least one test wrapper may be an interface associated with the memories and may be used in conjunction with processor 210 to perform test on and store fault information of the memories. The at least one test wrapper may be a Register Transfer Logic (RTL) code wrapper.

Test wrapper 204a and test wrapper 204m may include one or more repair registers based on the number of output bits of memory 202a and memory 202m. For example, if memory 202a has N output bits then test wrapper 204a may include N repair registers such as repair register 206a1 and repair register 206aN. In an embodiment of the invention, each test wrapper may include address locators, data generators and data comparators.

The one or more repair registers may store fault information of the corresponding output bit of the corresponding memory. For example, repair register 206aN may store fault information of $N^{th}$ output bit of memory 202a. The bit of repair register 206aN may be set to one if the $N^{th}$ output bit of memory 202a includes one or more failures.

Current error register 208a may be coupled to test wrapper 204a and processor 210, and current error register 208m may be coupled to test wrapper 204m and processor 210. In an embodiment of the invention, current error register 208a and current error register 208m may be integrated to test wrapper 204a and test wrapper 204m respectively. The bits of one or more current error registers may indicate whether the corresponding memories include one or more failures. For example, a bit of current error register 208a set to one may indicate that memory 202a includes one or more failures. The bit of current error register 208a may be set to one if any repair register of test wrapper 204a has a bit set to one.

The number of current error registers may be equal to the number of memories. For example, current error register 208a and current error register 208m corresponding to memory 202a and memory 202m.

Examples of processor 210 include but are not limited to a built-in self-test and repair (BISTR) processor and a self-test and repair (STAR) memory system processor. Processor 210 may include various built-in tests and commands to test the at least one memory. Processor 210 may include a built-in self test (BIST) module to execute test algorithms.

The number of enhance read registers and the number of enhance write registers may be equal to the number of memories. For example, enhance read register 214a and enhance write register 216a, and enhance read register 214m and enhance write register 216m corresponding to memory 202a and memory 202m respectively. The bit of the corresponding enhance register may indicate which margin of the memory needs to be varied. For example, if a bit of enhance read register 214a is set to one then read margin of memory 202a may be varied.

The number of BIRA registers may be equal to the number of memories. For example, BIRA register 212a and BIRA register 212m corresponding to memory 202a and memory 202m. The bit of corresponding BIRA register may indicate whether the memory include fatal fault. For example, if a bit of BIRA register 212a is set to one then memory 202a may include a fatal fault.

In an embodiment of the invention, fuse box 218 may be used for hard repair of the memory if the fault is only on one column of the memory.

System 200 described above may include a greater or a fewer number of elements than those included in FIG. 2.

Figure 3:
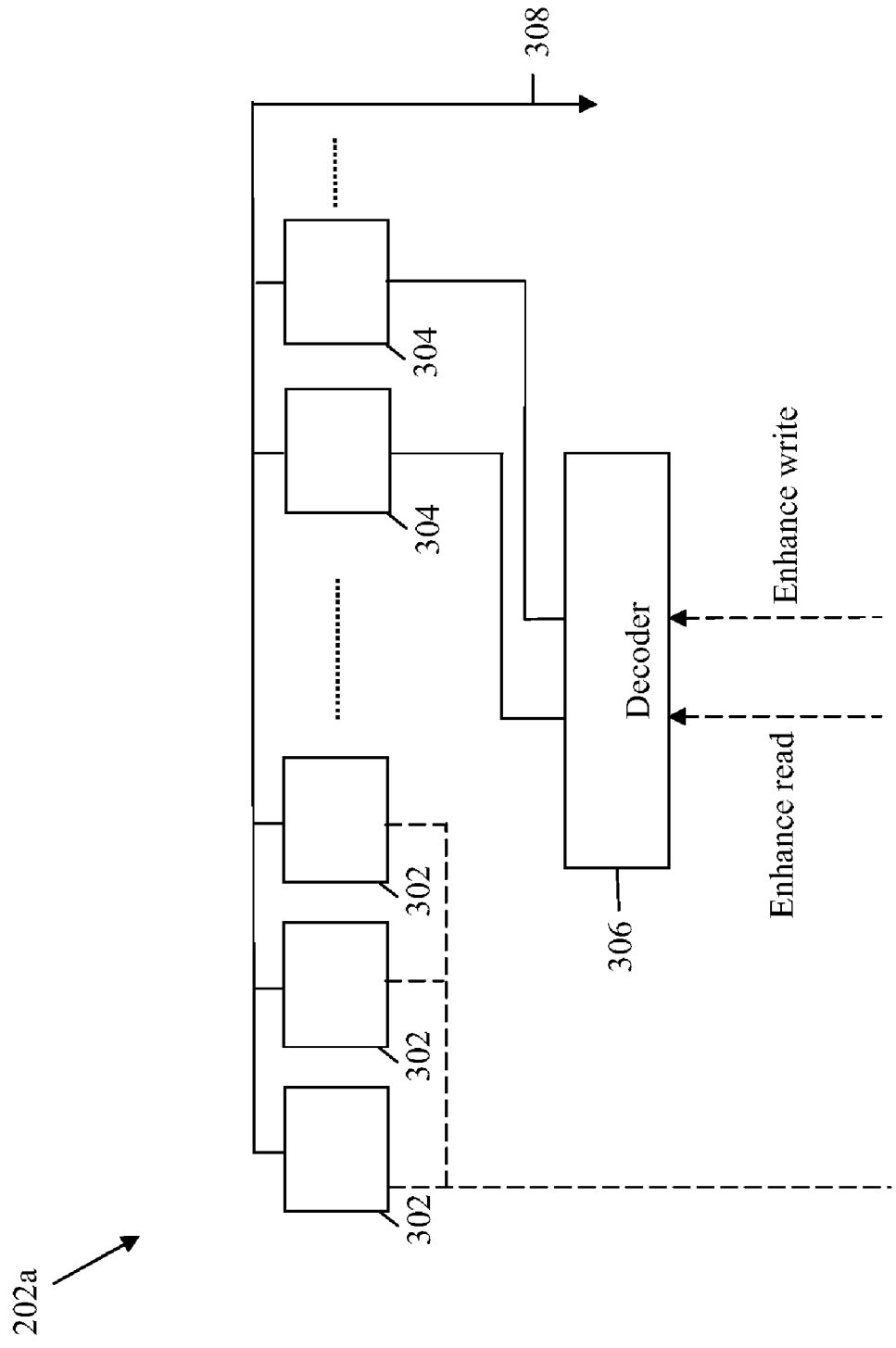
FIG. 3 is a schematic representation of a section of a memory in accordance with an embodiment of the invention.

Memory 202a including at least one bit cell mimicking structure, one or more bit cell structures and a decoder is explained in details in conjunction with FIG. 3.

FIG. 3 is a schematic representation of a section of memory 202a in accordance with an embodiment of the invention.

Memory 202a includes one or more bit cell structures 302, at least one bit cell mimicking structure 304, a decoder 306 and a bit line 308.

Each of one or more bit cell structures 302 and at least one bit cell mimicking structure 304 may be columns including several bit cells. In an embodiment of the invention, each of one or more bit cell structures 302 and at least one bit cell mimicking structure 304 may be a single bit cell.

At least one bit cell mimicking structure 304 may control discharging of bit line 308. The higher the number of at least one bit cell mimicking structure 304, the higher is the discharge rate of bit line 308. The starting of a read or write pulse may be indicated by a rising clock edge and the termination is decided by bit line 308.

Decoder 306 may receive an enhance read or enhance write signal based on type of failure in memory 202a. For example, decoder 306 may receive an enhance write signal if memory 202a has a write margin failure. Decoder 306 decodes the enhance write signal and sends it to write side of memory 202a. In an embodiment of the invention, based on one or more algorithms at least one bit cell mimicking structure 304 is disconnected from bit line 308 by gating the signals from the decoder. For example, to enhance the write margin at least one bit cell mimicking structure 304 is disconnected from bit line 308. The disconnecting reduces the discharge rate of bit line 308.

Memory 202a described above may include a greater or a fewer number of elements than those included in FIG. 3.

Figure 4A:
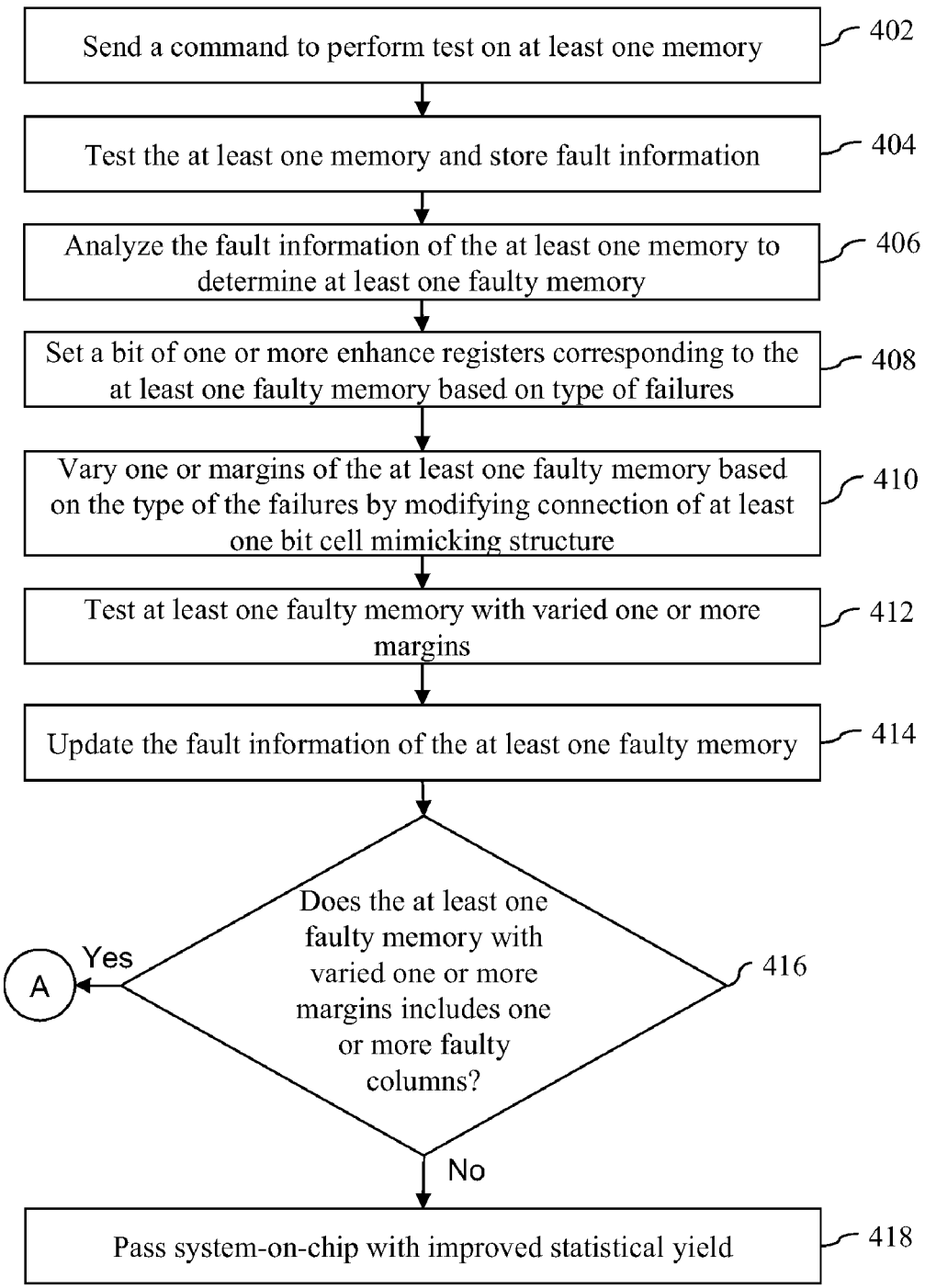
FIGS. 4a and 4b are a flowchart illustrating a method for improving statistical yield of a system-on-a-chip in accordance with an embodiment of the invention.
Figure 4B:
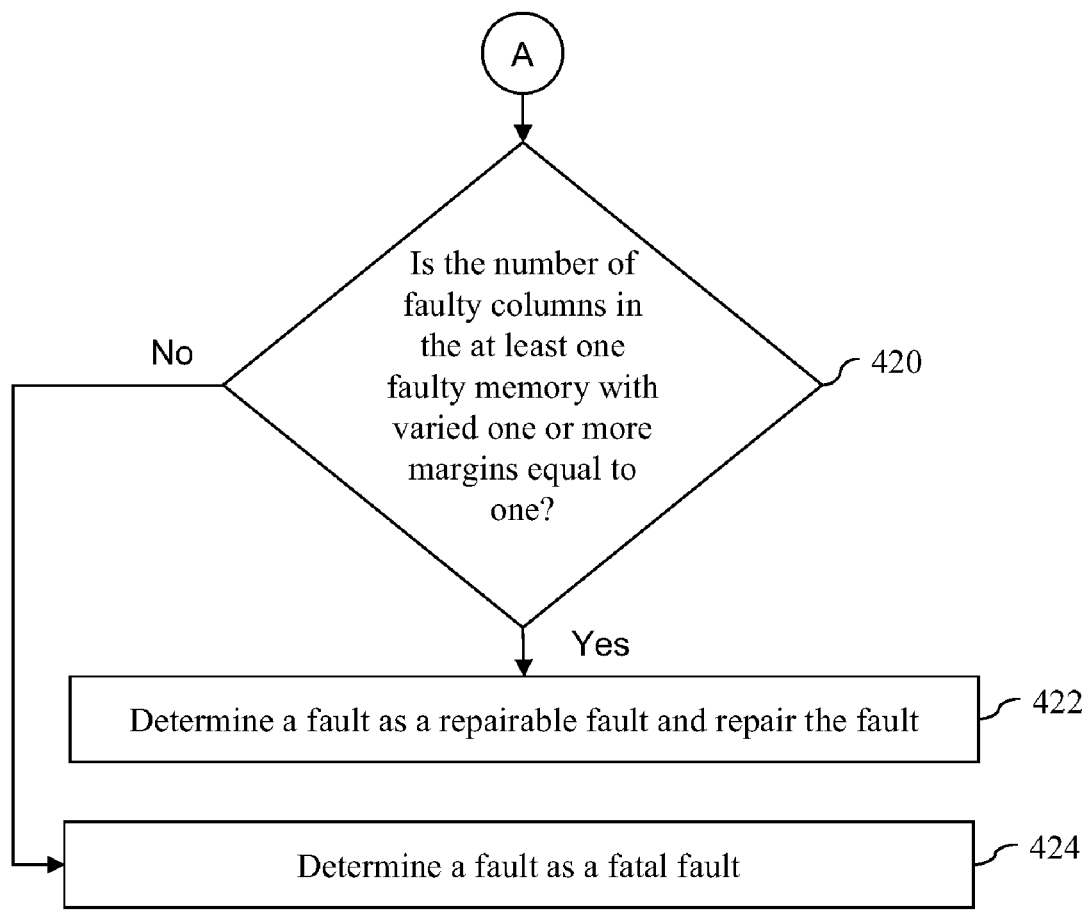

FIGS. 4a and 4b are a flowchart illustrating a method for improving statistical yield of a SOC, in accordance with an embodiment of the invention. The SOC includes at least one memory system including at least one memory. At step 402, a command is sent to at least one test wrapper to perform test on the at least one memory. In an embodiment of the invention, the tests include built-in self test (BIST). Thereafter, at step 404, the at least one memory is tested and fault information is stored.

At step 406, the fault information of the at least one memory is analyzed to determine at least one faulty memory. Each memory with a plurality of faulty columns may be identified as a faulty memory. In an embodiment of the invention, each memory with one or more faulty columns may be identified as a faulty memory. Each column with one or more failures on one or more bit cells may be identified as a faulty column.

The types of failures are also determined by analyzing the fault information. The types of failures may be determined by using one or more algorithms. For example, the one or more algorithms check if the time provided by internal self timed clock of a memory is sufficient for writing in the memory. If the time is not sufficient then the failure may be determined as a write margin failure. Examples of types of failures include but are not limited to margin failures, read margin failures, write margin failures and combinations thereof.

Thereafter, at step 408, the bits of one or more enhance registers corresponding to the at least one faulty memory is set based on the type of failures. For example, if a memory has a write margin failure then a bit of enhance write register is set to one and if a memory has a read margin failure then a bit of enhance read register is set to one.

At step 410, one or more margins of the at least one faulty memory are varied based on types of failures on the plurality of faulty columns of the at least one faulty memory. The one or margins are varied by enhancing the read or write margins of the at least one faulty memory. For example, if a memory has a write margin failure on the plurality of faulty columns then a bit of enhance write register is set to one and write margin of the memory is enhanced. Examples of one or more margins include but are not limited to read margins, write margins and combinations thereof. The one or more margins may be enhanced by modifying connection of at least one bit cell mimicking structure. The modifying includes disconnecting the at least one bit cell mimicking structure from a bit line. The modifying may be performed by using one or more algorithms. For example, to enhance write margin of a memory one or more bit cell mimicking structure on write section of the memory may be disconnected from a bit line. The disconnecting reduces the discharge rate of the bit line and enhances the write pulse width.

Thereafter at step 412, at least one faulty memory with varied one or more margins is tested by corresponding test wrapper. A command may be sent to corresponding test wrapper to perform the testing. In an embodiment of the invention, all the memories may be tested again by sending command to respective test wrappers. At step 414, fault information of the at least one faulty memory is updated.

Thereafter, at step 416, the updated fault information is analyzed to determine if the at least one faulty memory with varied one or more margins include any faulty column. If no faulty column is determined then the SOC with improved statistical yield is passed at step 418.

If one or more faulty columns is determined at step 416 the number of faulty columns in the at least one faulty memory with varied one or more margins is checked at step 420. If the number of faulty columns in the at least one faulty memory with varied one or more margins is one then at step 420, the fault is determined as a repairable fault and is repaired. The fault may be repaired using a soft repair. In an embodiment of the invention, the fault may be repaired using a hard repair.

If the number of faulty columns in the at least one faulty memory with varied one or more margins is more than one then at step 418, the fault is determined as a fatal fault.

The method described above is explained with the help of the following example. A SOC includes several STAR memory systems. A STAR memory system having a clock frequency of 400 MHz includes three memories such as M1, M2 and M3 with clock frequency 700 MHz, 600 MHz and 400 MHz respectively. Each of M1, M2 and M3 includes a memory array, a redundant column, a decoder, and N output bits. Each of the memory arrays includes one or more bit cell structures and at least one bit cell mimicking structure connected to a bit line. Each of the test wrappers includes N repair registers corresponding to N output bits of the memory. The STAR memory system also includes a test wrapper, a current error register, a BIRA register, an enhance read register and an enhance write register corresponding to each of M1, M2 and M3. Further, the STAR memory system includes a processor, and a fuse box.

The processor sends a command to the test wrappers to perform tests, such as read tests and write tests, on M1, M2 and M3. The test wrappers store the fault information of M1, M2 and M3 in their respective repair registers. If there is a failure in any of the output bit of any memory then a bit of corresponding repair register in corresponding test wrapper is set to one. If bit of any repair register is set to one then a bit of corresponding current error register becomes one. The processor reads the bit of current error register and finds it one. The processor then analyzes the fault information stored in the repair registers and determines failures on a plurality of columns in M1, M2 and M3. The processor also determines the types of failures such as read margin failure and write margin failure.

In an embodiment of the invention, M1 and M2 are determined as faulty memories. Based on the type of failures in M1 and M2, the processor sets the bits of corresponding enhance read registers or of corresponding enhance write registers to one.

In an embodiment of the invention, if M1 has a write margin failure then the processor sets the bit of respective enhance write register (EWR 1) to one and sends a signal to the decoder (D1). Further, if M3 has a read margin failure then the processor sets the bit of respective enhance read register (ERR 2) to one and sends the signal to the decoder (D2). D1 determines that the failure includes write margin failure and sends it to the write section of M1. D2 determines that the failure includes read margin failure and sends it to the read section of M2. At least one bit cell mimicking structure of M1 and at least one bit cell mimicking structure of M2 is then disconnected from respective bit line. For example, if the actual time spent to write in M1 is less than the time required to perform an error free writing then the at least one bit cell mimicking structure of M1 may be disconnected from the bit line to adjust the write margin. One or more algorithms are used to determine the number of bit cell mimicking structure that needs to be disconnected. For example, two bit cell mimicking structures may be disconnected and the time spent in writing on these two bit cell mimicking structures may be distributed over the entire memory array.

The disconnection improves the margin failure and enhances the statistical yield of M1 and M2, which in turn enhances the statistical yield of the STAR memory system.

The corresponding test wrappers then perform the tests on M1 and M2 with improved margins and update the fault information in the repair registers. The processor then analyzes the updated fault information and may find M1 and M2 fault free.

If there is still any faulty column in either M1 or M2 then based on the number of faulty columns the fault is determined as a fatal fault or a repairable fault.

If more than one column of any memory is faulty then the fault is determined as a fatal fault. The processor then sets a bit of the BIRA register corresponding to the faulty memory as one.

If failures are present on only one column of any memory then the faulty column is repaired by using the redundant column.

Since, M1 and M2 do not affect the clock frequency of the system the statistical yield of the SOC may be improved without affecting the system clock frequency.

The method described above includes different steps involved in improving statistical yield of the SOC. The method may include a greater or a fewer number of steps than those included in FIGS. 4*a* and 4*b*.

One or more steps of the method described in FIGS. 4*a* and 4*b* may be implemented using a computer program product. Examples of the computer program product include but are not limited to memory devices, tapes, disks, cassettes, integrated circuits, servers, online softwares, download links, installation links, and online links.

The varying of margins improves the statistical yield of the memory systems and hence, improves the statistical yield of the SOCs. Further, the memories having margin failures on multiple columns may be repaired by enhancing the margins.

The foregoing description sets forth numerous specific details to convey a thorough understanding of embodiments of the invention. However, it will be apparent to one skilled in the art that embodiments of the invention may be practiced without these specific details. Some well-known features are not described in detail in order to avoid obscuring the invention. Other variations and embodiments are possible in light of above teachings, and it is thus intended that the scope of invention not be limited by this Detailed Description, but only by the following Claims.

What is claimed is:

1. A method for improving statistical yield of a system-on-a-chip, the system-on-a-chip comprising at least one memory, the method comprising:
   determining at least one faulty memory;
   varying one or more margins of the at least one faulty memory; and
   testing the at least one faulty memory with varied one or more margins.

2. The method of claim 1, wherein determining the at least one faulty memory comprises determining one or more faulty columns in the at least one faulty memory.

3. The method of claim 1, wherein varying the one or more margins comprises varying one or more read margins.

4. The method of claim 1, wherein varying the one or more margins comprises varying one or more write margins.

5. The method of claim 1, wherein varying the one or more margins comprises setting a bit of one or more enhance registers.

6. The method of claim 1, wherein varying the one or more margins comprises modifying connection of at least one bit cell mimicking structure.

7. The method of claim 1 further comprising:
   determining how many columns are faulty in the at least one faulty memory with varied one or more margins; and
   repairing the at least one faulty memory with varied one or more margins based on how many columns were determined to be faulty.

8. The method of claim 1 further comprising testing the at least one memory.

9. The method of claim 1 further comprising determining types of failures in the at least one faulty memory.

10. The method of claim 1 further comprising storing and updating fault information of the at least one faulty memory.

11. A method comprising:
   identifying a plurality of faulty columns in a memory;
   varying one or more margins of the memory based on types of failures of the plurality of faulty columns; and
   testing the memory with varied one or more margins.

12. A system comprising:
   at least one memory;
   one or more enhance registers corresponding to the at least one memory for indicating one or more margins that must be varied;
   a processor, the processor varying the one or more margins of at least one faulty memory; and
   at least one test wrapper, the at least one test wrapper testing at least one faulty memory with varied one or more margins.

13. A computer program product comprising:
   a machine-readable medium; and
   instructions carried by the machine readable medium and operable to cause a programmable processor to:
      determine at least one faulty memory;
      vary one or more margins of the at least one faulty memory; and
      send a command to test at least one faulty memory with varied one or more margins.

14. The computer program product of claim 13, wherein the instructions carried by the machine readable medium is operable to cause the programmable processor to determine the at least one faulty memory by identifying one or more faulty columns in the at least one faulty memory.

15. The computer program product of claim 13, wherein the instructions carried by the machine readable medium is operable to cause the programmable processor to vary the one or more margins by varying one or more write margins.

16. The computer program product of claim 13, wherein the instructions carried by the machine readable medium is operable to cause the programmable processor to vary the one or more margins by varying one or more read margins.

17. The computer program product of claim 13, wherein the instructions carried by the machine readable medium is operable to cause the programmable processor to vary the one or more margins by setting a bit of one or more enhance registers.

18. The computer program product of claim 13, wherein the instructions carried by the machine readable medium is operable to cause the programmable processor to vary the one or more margins by modifying a connection of at least one bit cell mimicking structure.

19. The computer program product of claim 13, wherein the instructions carried by the machine readable medium is operable to cause the programmable processor to:
   determine how many columns are faulty in the at least one faulty memory with varied one or more margins; and
   repair the at least one faulty memory with varied one or more margins based on how many columns were determined to be faulty.

20. The computer program product of claim 13, wherein the instructions carried by the machine readable medium is operable to cause the programmable processor to determine types of failures in the at least one faulty memory.

* * * * *